United States Patent
Huang et al.

(10) Patent No.: US 12,131,942 B2
(45) Date of Patent: Oct. 29, 2024

(54) SOURCE/DRAIN ISOLATION STRUCTURE AND METHODS THEREOF

(71) Applicant: Taiwan Semiconductor Manufacturing Co., Ltd., Hsinchu (TW)

(72) Inventors: Lin-Yu Huang, Hsinchu (TW); Sheng-Tsung Wang, Hsinchu (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/344,965

(22) Filed: Jun. 30, 2023

(65) Prior Publication Data

US 2023/0343633 A1    Oct. 26, 2023

Related U.S. Application Data

(60) Division of application No. 17/649,503, filed on Jan. 31, 2022, now Pat. No. 11,694,921, which is a
(Continued)

(51) Int. Cl.
*H01L 21/762* (2006.01)
*H01L 21/311* (2006.01)
*H01L 27/088* (2006.01)

(52) U.S. Cl.
CPC .. *H01L 21/76224* (2013.01); *H01L 21/31144* (2013.01); *H01L 27/0886* (2013.01)

(58) Field of Classification Search
CPC ......... H01L 21/76224; H01L 21/31144; H01L 27/0886
See application file for complete search history.

(56) References Cited

U.S. PATENT DOCUMENTS

| 7,719,043 B2 | 5/2010 | Yamagami |
|---|---|---|
| 8,772,109 B2 | 7/2014 | Colinge |
| (Continued) | | |

FOREIGN PATENT DOCUMENTS

DE    102016218697 A1    3/2017

OTHER PUBLICATIONS

German Examination Report issued in Application No. 102019116063. 4, 10 pages.

*Primary Examiner* — Peniel M Gumedzoe
(74) *Attorney, Agent, or Firm* — Haynes and Boone, LLP

(57) ABSTRACT

A method and structure directed to providing a source/drain isolation structure includes providing a device having a first source/drain region adjacent to a second source/drain region. A masking layer is deposited between the first and second source/drain regions and over an exposed first part of the second source/drain region. After depositing the masking layer, a first portion of an ILD layer disposed on either side of the masking layer is etched, without substantial etching of the masking layer, to expose a second part of the second source/drain region and to expose the first source/drain region. After etching the first portion of the ILD layer, the masking layer is etched to form an L-shaped masking layer. After forming the L-shaped masking layer, a first metal layer is formed over the exposed first source/drain region and a second metal layer is formed over the exposed second part of the second source/drain region.

20 Claims, 12 Drawing Sheets

Related U.S. Application Data continuation of application No. 16/947,932, filed on Aug. 24, 2020, now Pat. No. 11,239,106, which is a continuation of application No. 16/427,594, filed on May 31, 2019, now Pat. No. 10,755,964.

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 8,994,119 B2 | 3/2015 | Yin |
| 9,236,267 B2 | 1/2016 | De et al. |
| 9,236,300 B2 | 1/2016 | Liaw |
| 9,405,490 B2 | 8/2016 | Park |
| 9,520,482 B1 | 12/2016 | Chang et al. |
| 9,576,814 B2 | 2/2017 | Wu et al. |
| 9,647,115 B1 | 5/2017 | Okuno |
| 2015/0187634 A1 | 7/2015 | Chiang |
| 2015/0333136 A1 | 11/2015 | Xie |
| 2016/0111518 A1 | 4/2016 | Chang |
| 2017/0373189 A1 | 12/2017 | Lee |
| 2018/0350821 A1 | 12/2018 | Lin |
| 2019/0035938 A1 | 1/2019 | Park |
| 2019/0067417 A1* | 2/2019 | Ching ............ H01L 21/823437 |
| 2020/0075421 A1 | 3/2020 | Wu |

* cited by examiner

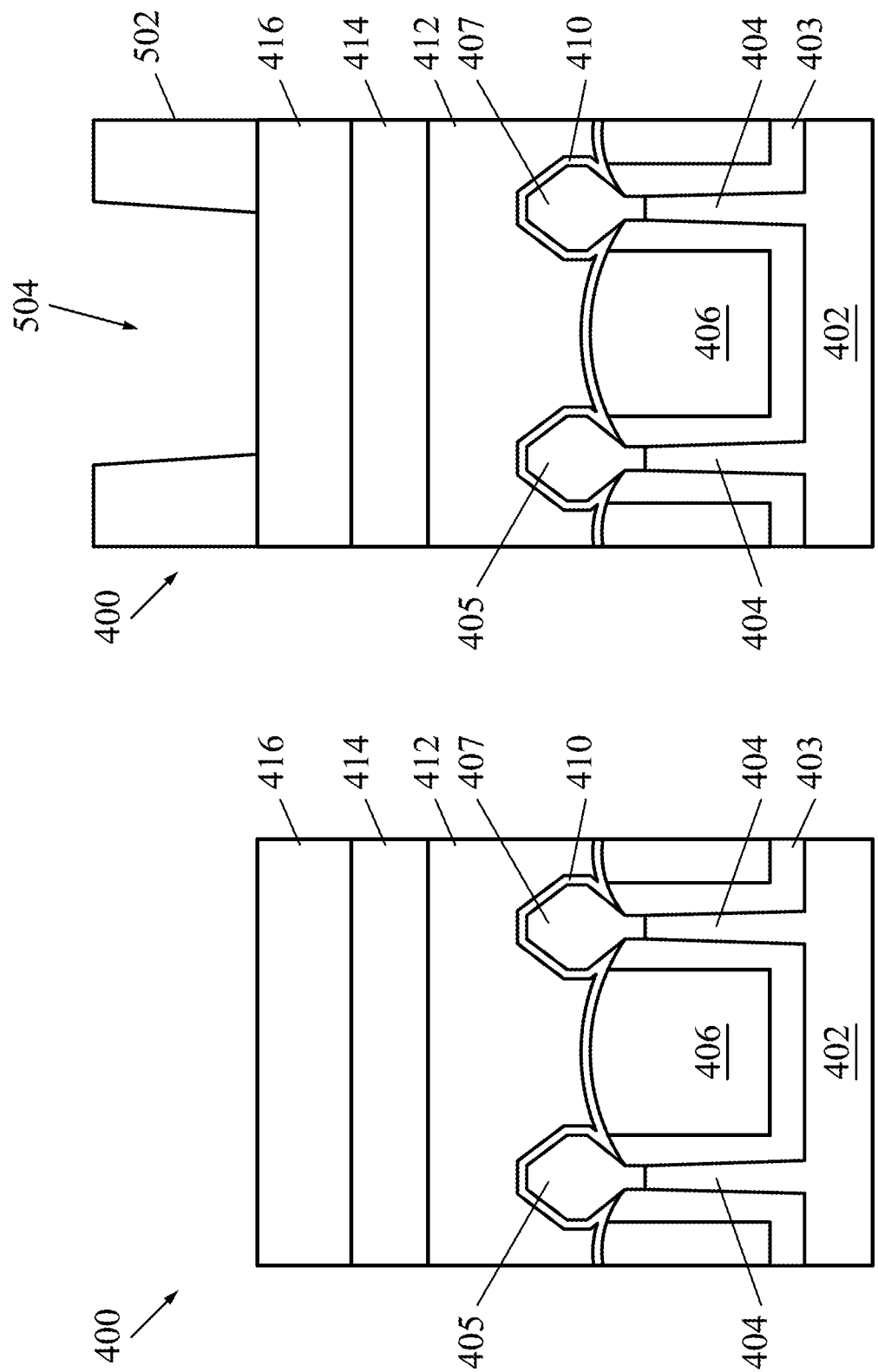

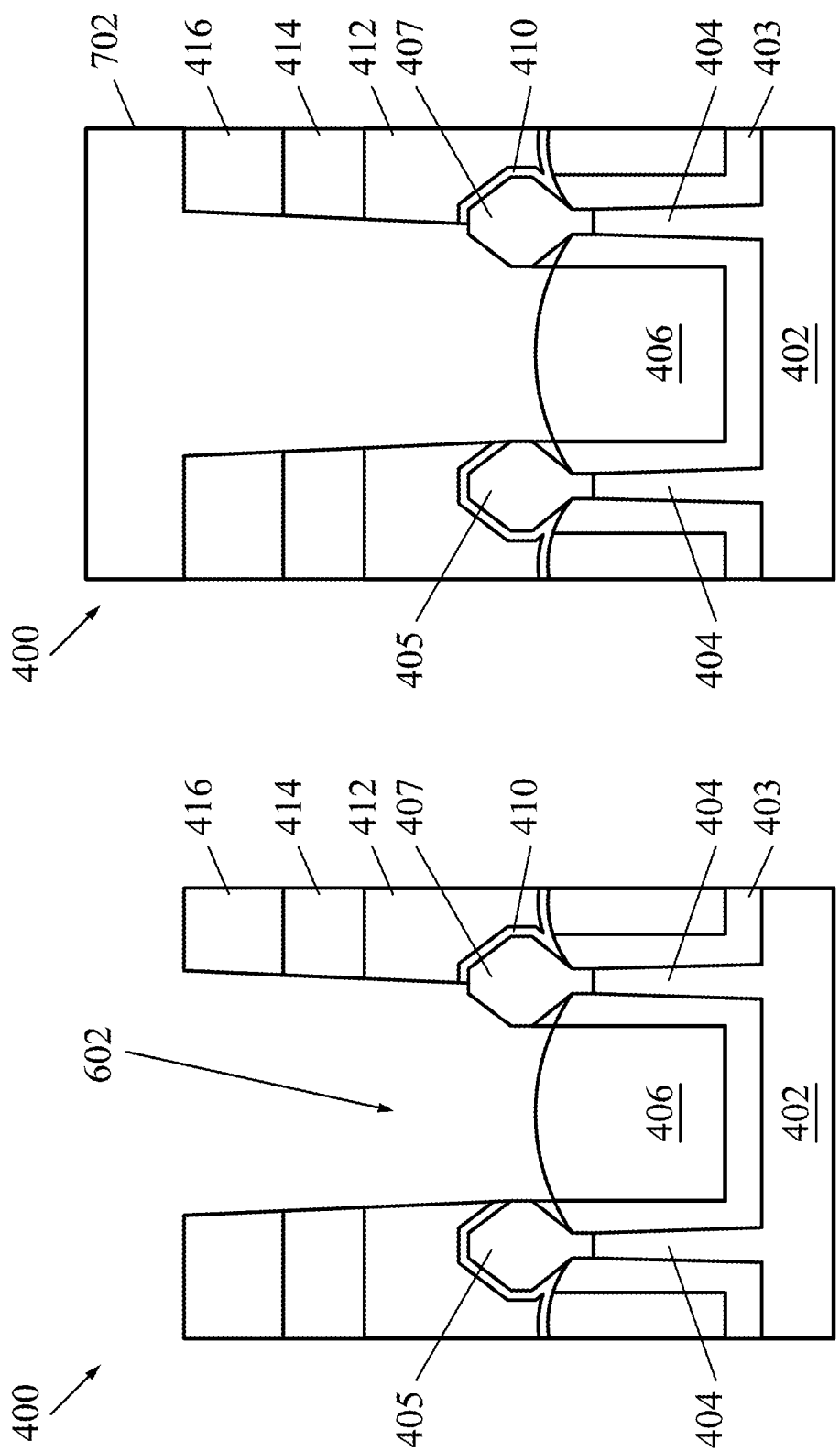

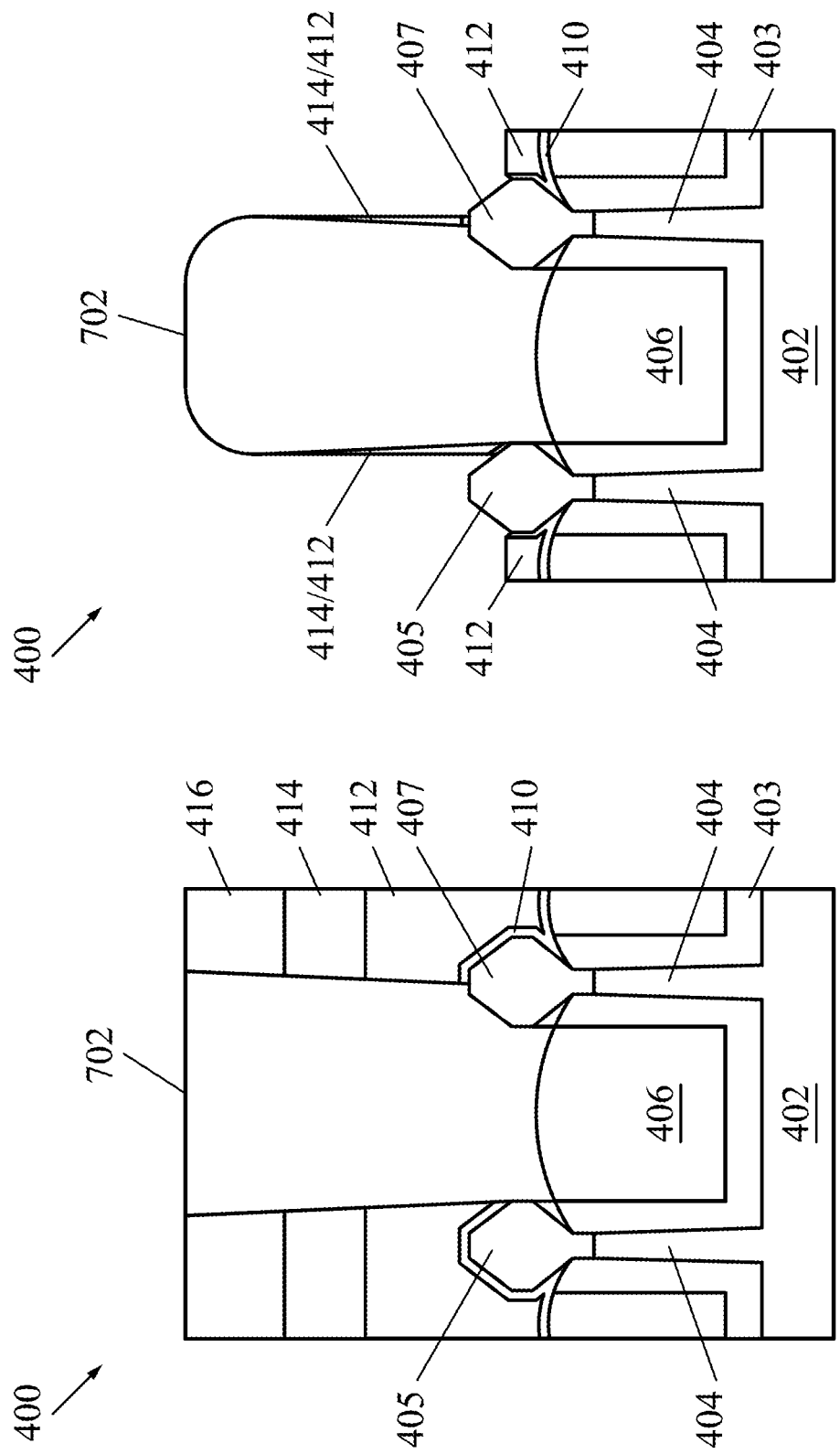

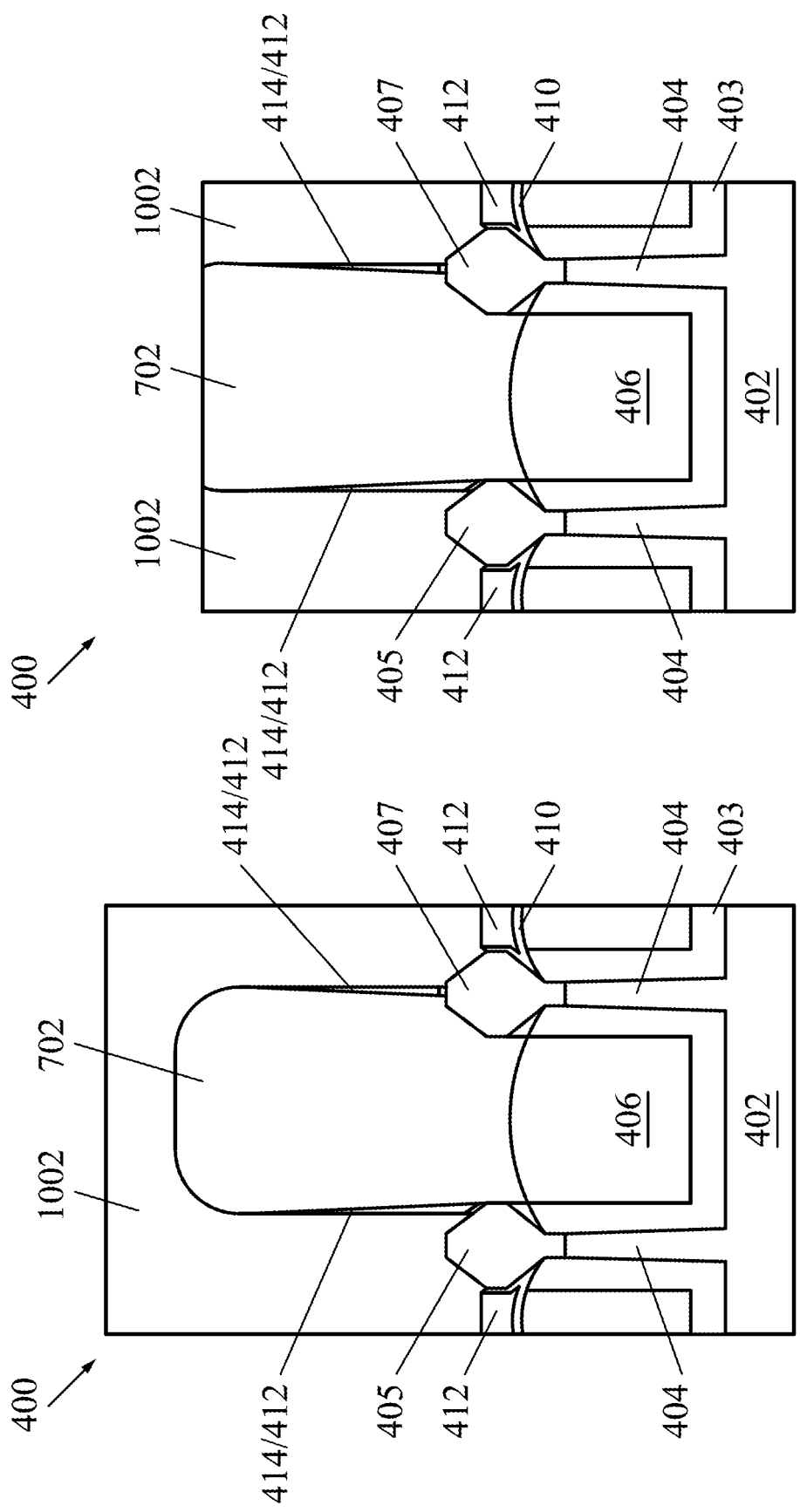

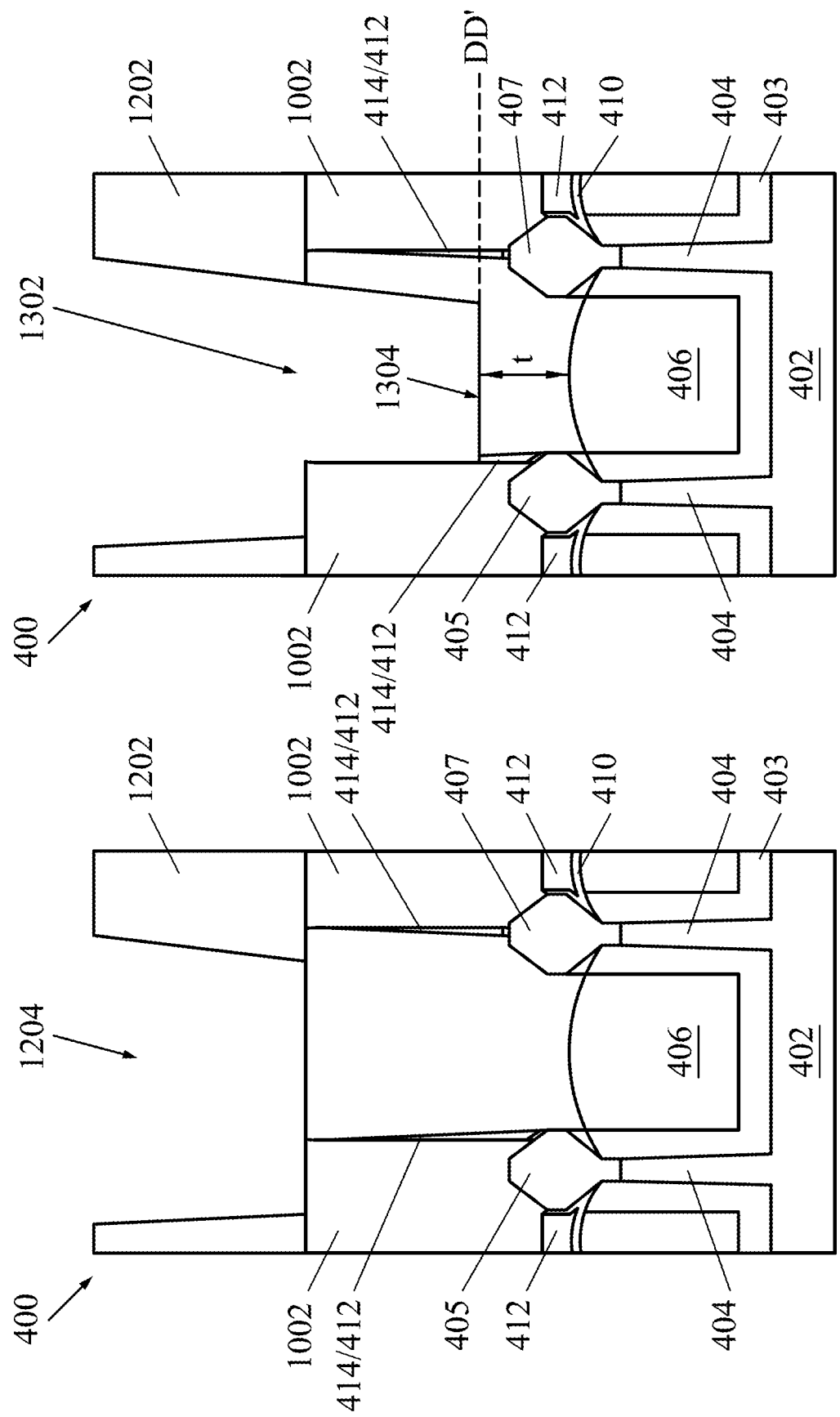

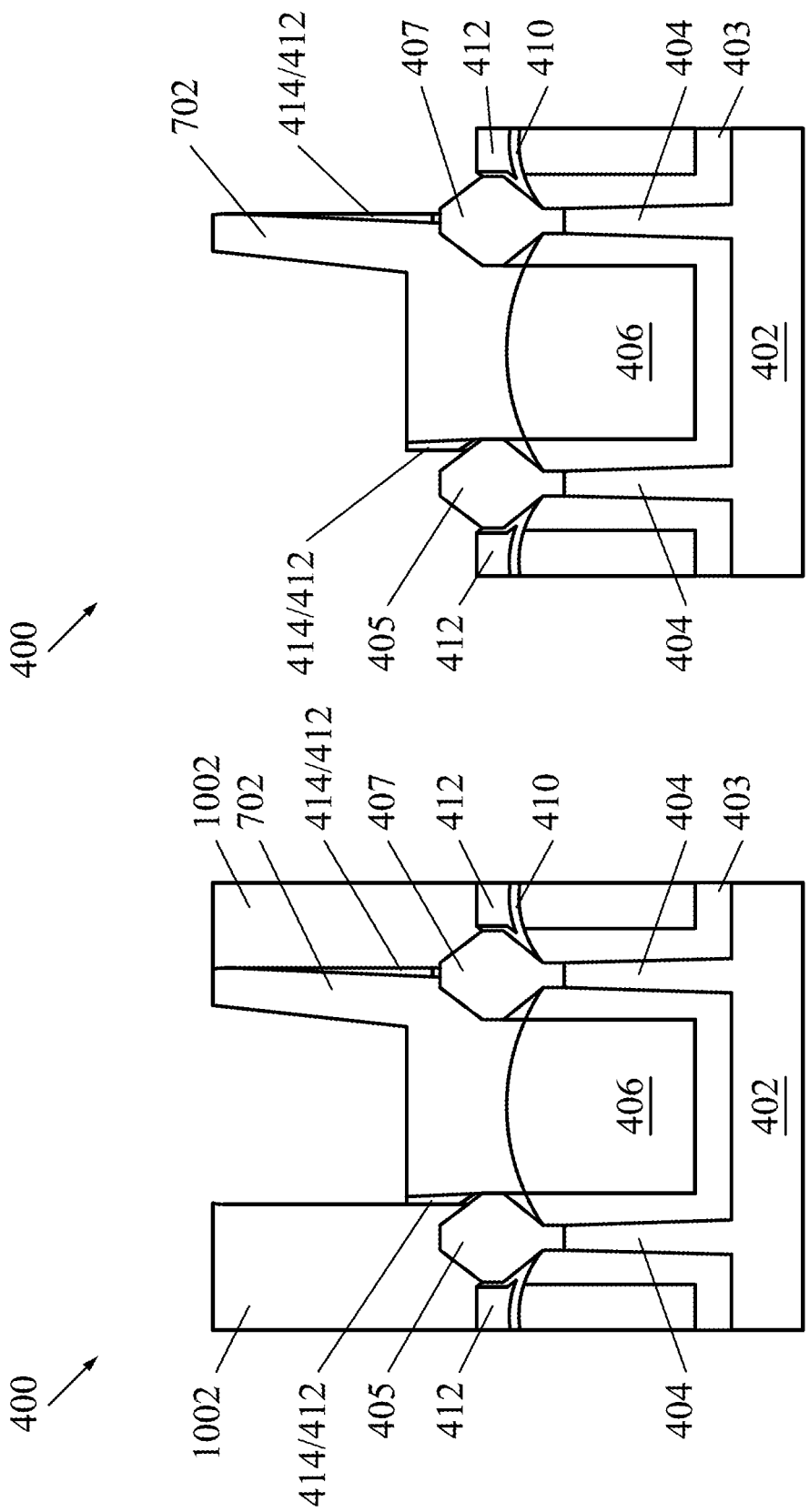

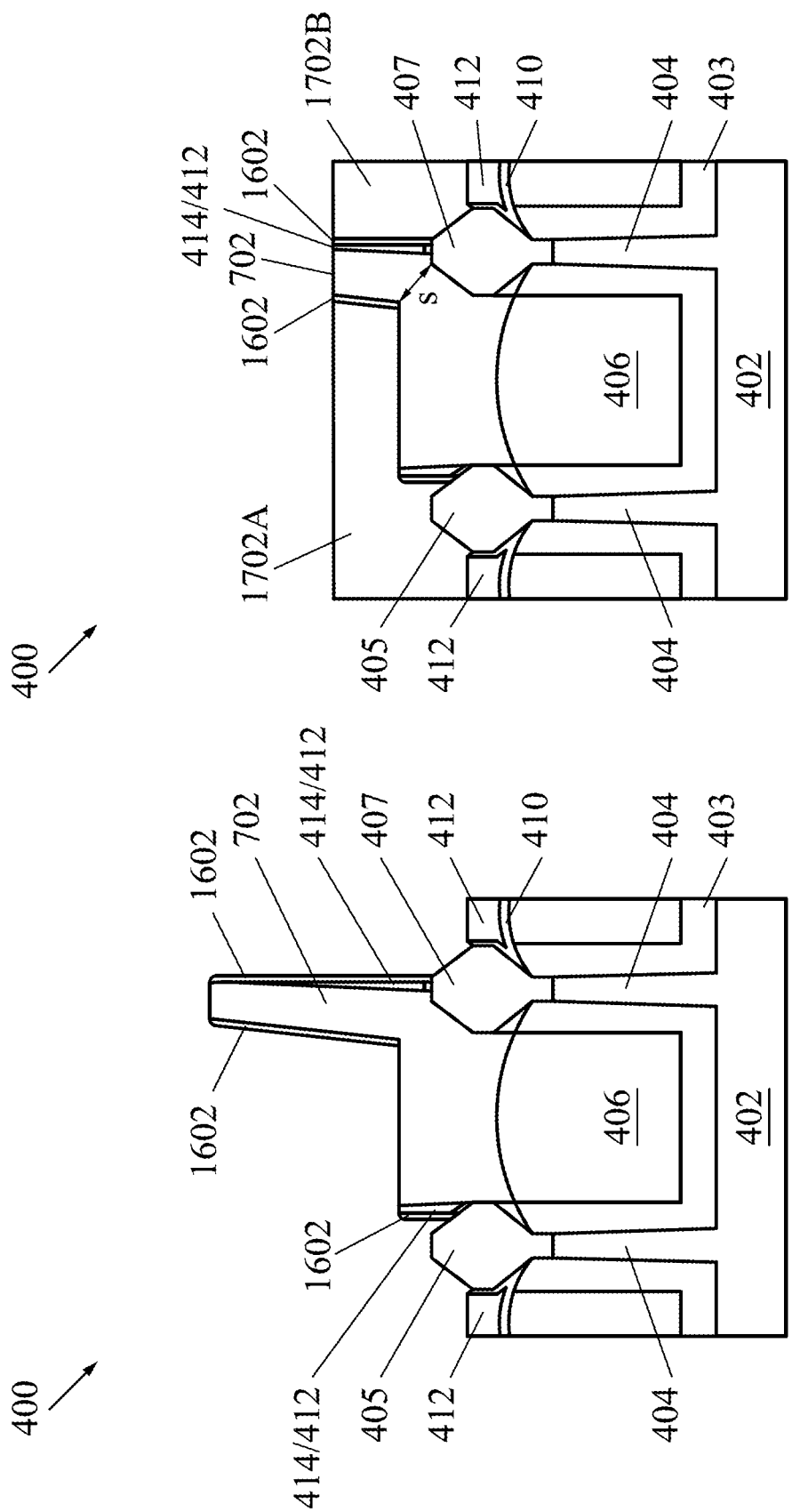

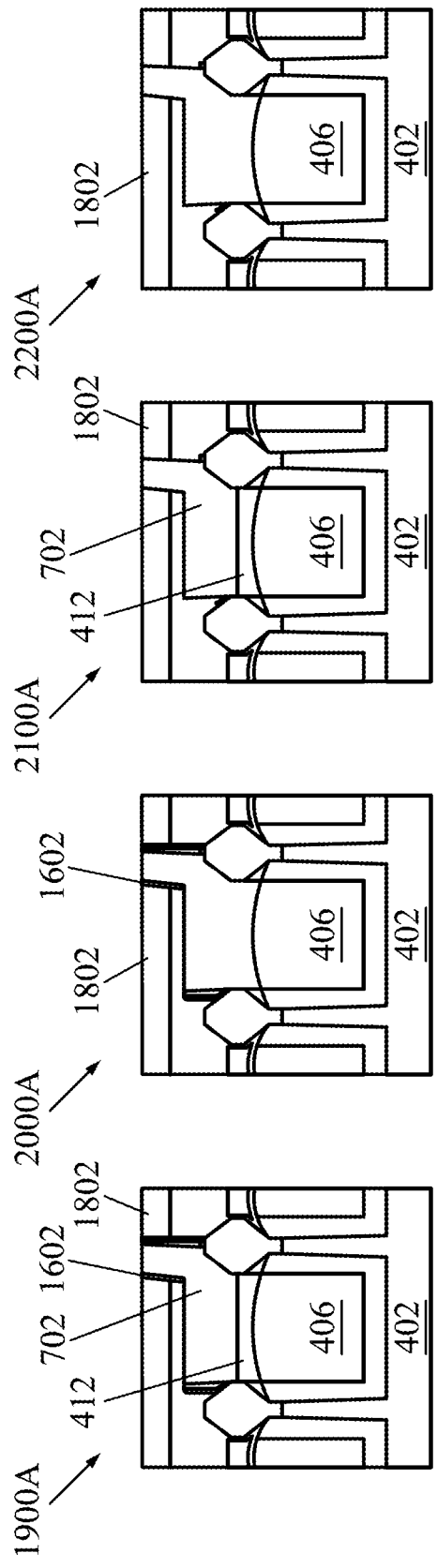
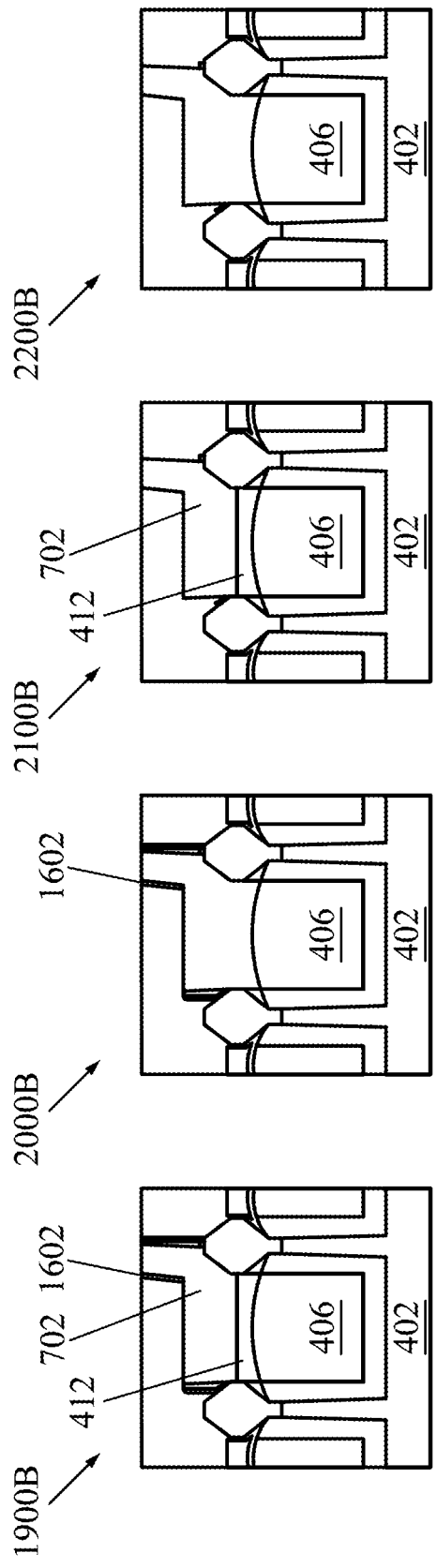

SOURCE/DRAIN ISOLATION STRUCTURE AND METHODS THEREOF

CROSS-REFERENCE TO RELATED APPLICATIONS

This application is a divisional of U.S. patent application Ser. No. 17/649,503, filed Jan. 31, 2022, issuing as U.S. Pat. No. 11,694,921, which is a continuation of U.S. patent application Ser. No. 16/947,932, filed Aug. 24, 2020, now U.S. Pat. No. 11,239,106, which is a continuation of U.S. patent application Ser. No. 16/427,594, filed May 31, 2019, now U.S. Pat. No. 10,755,964, the disclosures of which are hereby incorporated by reference in their entireties.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

In particular, dimensional scaling has presented a challenge to the formation of metal contacts to source/drain features (e.g., such as a source/drain epitaxial layer) of a transistor. For example, during formation of metal contacts to separate, but adjacent, source/drain features, a dielectric layer may be formed to provide an isolation region between adjacent metal contact layers, and between a metal contact layer and an adjacent source/drain feature. However, in at least some conventional processes, an aggressively-scaled cut metal region, which is used to at least partially define a size of the dielectric layer, results in the dielectric layer being unable to provide adequate isolation. In some examples, and because of the scaled cut metal region, bridging (e.g., electrical shorting) may occur between a metal contact layer and an adjacent source/drain feature. In addition, the dielectric layer of the isolation region may suffer from time-dependent dielectric breakdown (TDDB) and thus fail to provide the desired isolation. In some cases, a hardmask used to keep adjacent metal contact layers separated may peel off during processing (e.g., during etching to provide the patterned dielectric layer for the isolation region), resulting in an electrical short between subsequently formed adjacent metal contact layers. Further, the material used for the dielectric layer may itself be more susceptible to having poor reliability (e.g., such as due to TDDB).

Thus, existing techniques have not proved entirely satisfactory in all respects.

BRIEF DESCRIPTION OF THE DRAWINGS

Aspects of the present disclosure are best understood from the following detailed description when they are read with the accompanying figures. It is noted that, in accordance with the standard practice in the industry, various features are not drawn to scale. In fact, the dimensions of the various features may be arbitrarily increased or reduced for clarity of discussion.

FIGS. 4, 5, 6, 7, 8, 9, 10, 11, 12, 13, 14, 15, 16, 17, and 18 provide cross-sectional views, along a plane substantially parallel to a plane defined by section BB' or section CC' of FIG. 1, of an exemplary device fabricated according to one or more steps of the method of FIG. 3; and FIGS. 19A/19B, 20A/20B, 21A/21B, and 22A/22B illustrate various embodiments of device structures for devices fabricated according to one or more steps of the method of FIG. 3.

DETAILED DESCRIPTION

Figure 1:
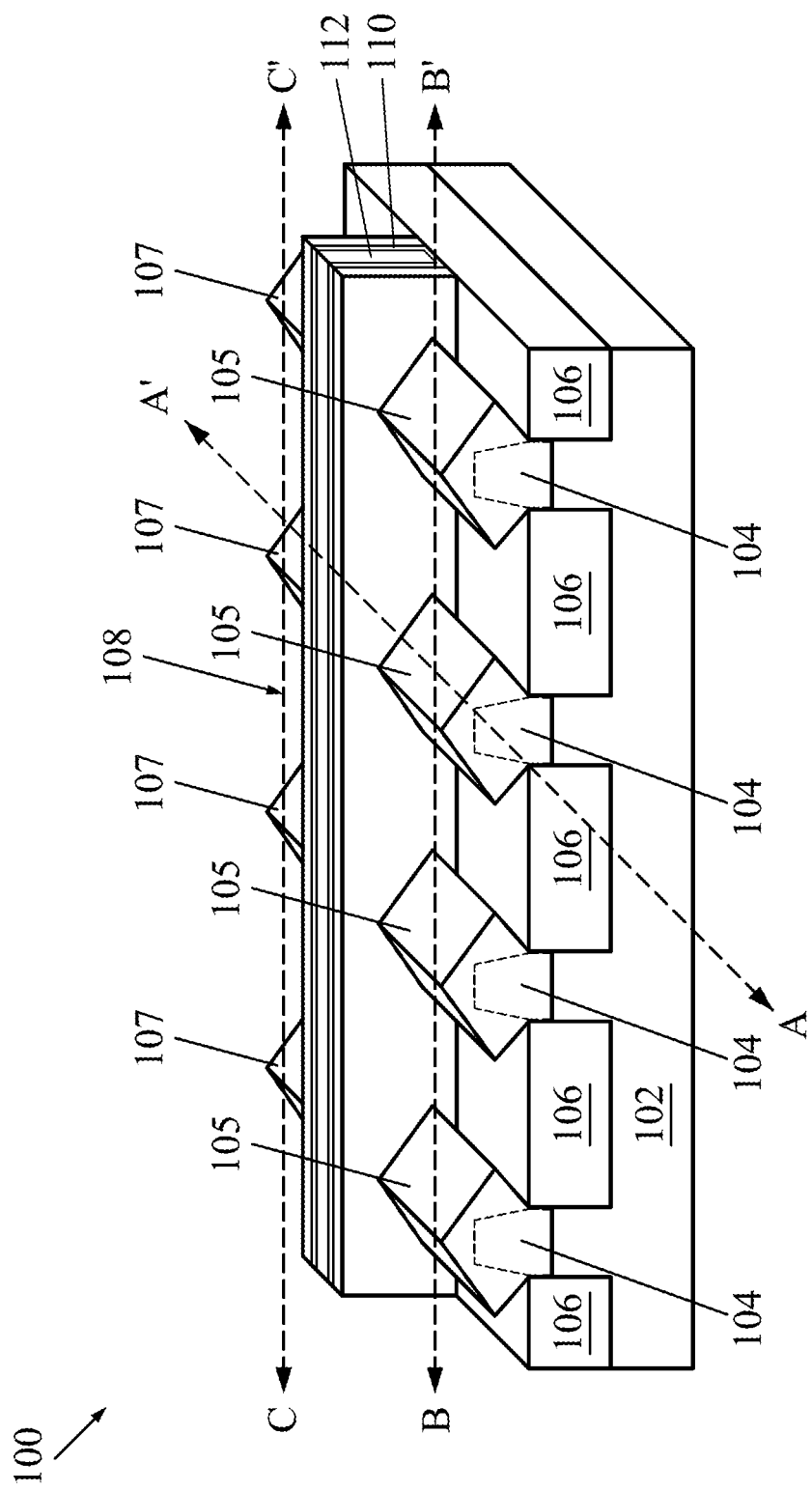
FIG. 1 is perspective view of an embodiment of a FinFET device according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or other configuration. One of ordinary skill may recognize other embodiments of semiconductor devices that may benefit from aspects of the present disclosure. For example, some embodiments as described herein may also be applied to gate-all-around (GAA) devices, Omega-gate (Ω-gate) devices, or Pi-gate (π-gate) devices.

Illustrated in FIG. 1 is a FinFET device 100. The FinFET device 100 includes one or more fin-based, multi-gate field-effect transistors (FETs). The FinFET device 100 includes a substrate 102, at least one fin element 104 extending from the substrate 102, isolation regions 106, and a gate structure 108 disposed on and around the fin-element 104. The substrate 102 may be a semiconductor substrate such as a silicon substrate. The substrate may include various layers, including conductive or insulating layers formed on a semiconductor substrate. The substrate may include various doping configurations depending on design requirements as is known in the art. The substrate may also include other semiconductors such as germanium, silicon carbide (SiC), silicon germanium (SiGe), or diamond. Alternatively, the substrate may include a compound semiconductor and/or an alloy semiconductor. Further, in some embodiments, the substrate may include an epitaxial layer (epi-layer), the substrate may be strained for performance enhancement, the substrate may include an SOI structure, and/or the substrate may have other suitable enhancement features.

The fin-element 104, like the substrate 102, may comprise silicon or another elementary semiconductor, such as germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, InGaAs, GaInP, and/or GaInAsP; or combinations thereof. The fins 104 may be fabricated using suitable processes including photolithography and etch processes. The photolithography process may include forming a photoresist layer (resist) overlying the substrate (e.g., on a silicon layer), exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate while an etch process forms recesses into the silicon layer, thereby leaving an extending fin 104. The recesses may be etched using a dry etch (e.g., chemical oxide removal), a wet etch, and/or other suitable processes. Numerous other embodiments of methods to form the fins 104 on the substrate 102 may also be used.

Each of the plurality of fins 104 also include a source region 105 and a drain region 107 where the source/drain regions 105, 107 are formed in, on, and/or surrounding the fin 104. The source/drain regions 105, 107 may be epitaxially grown over the fins 104. A channel region of a transistor is disposed within the fin 104, underlying the gate structure 108, along a plane substantially parallel to a plane defined by section AA' of FIG. 1. In some examples, the channel region of the fin includes a high-mobility material such as germanium, as well as any of the compound semiconductors or alloy semiconductors discussed above and/or combinations thereof. High-mobility materials include those materials with an electron mobility greater than silicon. For example, higher than Si which has an intrinsic electron mobility at room temperature (300K) of around 1350 $cm^2/V$-s and a hole mobility of around 480 $cm^2/V$-s, in some instances.

The isolation regions 106 may be shallow trench isolation (STI) features. Alternatively, a field oxide, a LOCOS feature, and/or other suitable isolation features may be implemented on and/or within the substrate 102. The isolation regions 106 may be composed of silicon oxide, silicon nitride, silicon oxynitride, fluorine-doped silicate glass (FSG), a low-k dielectric, combinations thereof, and/or other suitable material known in the art. In an embodiment, the isolation structures are STI features and are formed by etching trenches in the substrate 102. The trenches may then be filled with isolating material, followed by a chemical mechanical polishing (CMP) process. However, other embodiments are possible. In some embodiments, the isolation regions 106 may include a multi-layer structure, for example, having one or more liner layers.

The gate structure 108 includes a gate stack including a gate dielectric layer 110, and a metal layer 112 formed over the gate dielectric layer. In some embodiments, the gate dielectric layer 110 may include an interfacial layer formed over the channel region of the fin 104 and a high-K dielectric layer over the interfacial layer. The interfacial layer of the gate dielectric layer 110 may include a dielectric material such as silicon oxide layer ($SiO_2$) or silicon oxynitride (SiON). The high-K dielectric layer of the gate dielectric layer 110 may include $HfO_2$, $TiO_2$, HfZrO, $Ta_2O_3$, $HfSiO_4$, $ZrO_2$, $ZrSiO_2$, combinations thereof, or other suitable materials. In still other embodiments, the gate dielectric layer 110 may include silicon dioxide or another suitable dielectric. The gate dielectric layer 110 may be formed by chemical oxidation, thermal oxidation, atomic layer deposition (ALD), physical vapor deposition (PVD), chemical vapor deposition (CVD), and/or other suitable methods. The metal layer 112 may include a conductive layer such as W, TiN, TaN, WN, Re, Ir, Ru, Mo, Al, Cu, Co, Ni, combinations thereof, and/or other suitable compositions. In some embodiments, the metal layer 112 may include a first group of metal materials for N-type FinFETs and a second group of metal materials for P-type FinFETs. Thus, the FinFET device 100 may include a dual work-function metal gate configuration. For example, the first metal material (e.g., for N-type devices) may include metals having a work function substantially aligned with a work function of the substrate conduction band, or at least substantially aligned with a work function of the conduction band of the channel region of the fin 104. Similarly, for example, the second metal material (e.g., for P-type devices) may include metals having a work function substantially aligned with a work function of the substrate valence band, or at least substantially aligned with a work function of the valence band of the channel region of the fin 104. Thus, the metal layer 112 may provide a gate electrode for the FinFET device 100, including both N-type and P-type FinFET devices 100. In some embodiments, the metal layer 112 may alternately include a polysilicon layer. The metal layer 112 may be formed using PVD, CVD, electron beam (e-beam) evaporation, and/or other suitable process. In some embodiments, sidewall spacers are formed on sidewalls of the gate structure 108. The sidewall spacers may include a dielectric material such as silicon oxide, silicon nitride, silicon carbide, silicon oxynitride, or combinations thereof.

As noted above, aggressive scaling down of IC dimensions has presented a challenge to the formation of metal contacts to source/drain features of a transistor (e.g., such as source/drain regions 105, 107 of the FinFET device 100). For example, during formation of metal contacts to separate, but adjacent, source/drain features (e.g., such as adjacent source or drain regions along a plane substantially parallel to a plane defined by section BB' or section CC' of FIG. 1), a dielectric layer may be formed to provide an isolation region between adjacent metal contact layers, and between a metal contact layer and an adjacent source/drain feature. In various examples, an aggressively-scaled cut metal region, which is used to at least partially define a size of the dielectric isolation region, results in the dielectric layer being unable to provide adequate isolation between adjacent metal layers (e.g., such as between metal contact layers of separate, but adjacent, source/drain features), and/or between a metal contact layer and an adjacent source/drain region. For instance, due to the scaled cut metal region and resulting narrow dielectric isolation region, bridging (e.g., electrical shorting) may occur between a metal contact layer and an adjacent source/drain region. In addition, the dielectric layer providing the isolation region may suffer from time-dependent dielectric breakdown (TDDB) (particularly where the dielectric layer is most narrow) and thus fail to provide the desired isolation. In some cases, a hardmask used to keep adjacent metal contact layers (e.g., contacting adjacent source/drain features) separated may peel off during processing (e.g., during etching to provide the patterned dielectric layer for the isolation region), resulting in an electrical short between the subsequently formed adjacent metal contact layers. Further, the material used for the dielectric layer may itself be more susceptible to having poor reliability (e.g., such as due to TDDB). Thus, existing techniques have not proved entirely satisfactory in all respects.

Figure 2:
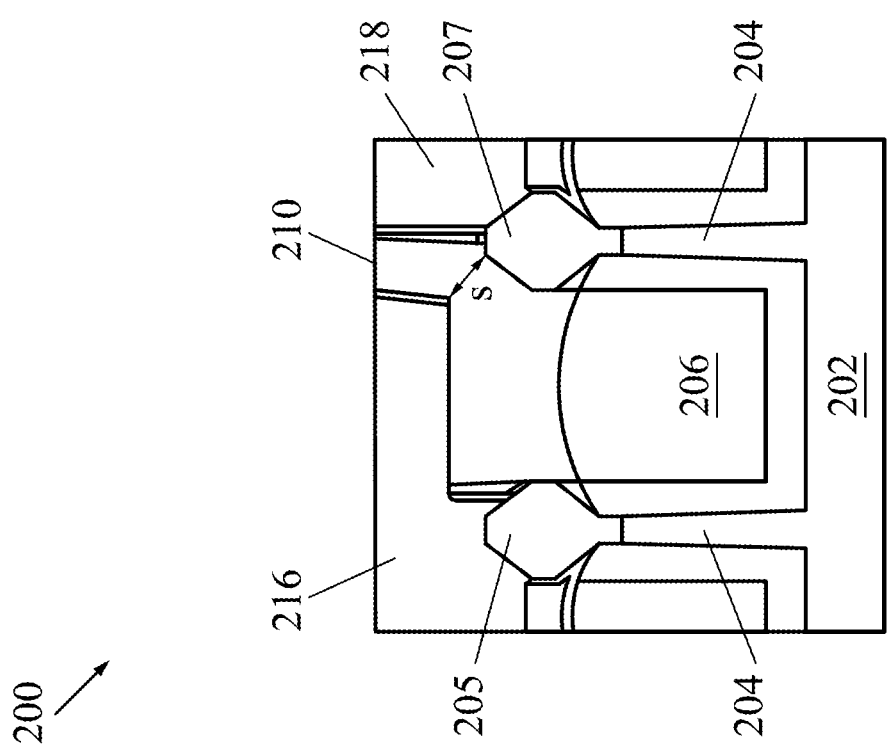
FIG. 2 illustrates a cross-sectional view of an exemplary device along a plane similar to that defined by section BB' or section CC' of FIG. 1, in accordance with some embodiments.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures directed to forming a source/drain isolation structure. In particular, and in at least some embodiments, the disclosed source/drain isolation structure is formed using a more robust hardmask (e.g., thicker than at least some conventional hardmasks) that will not peel off during an etching process. In addition, the source/drain isolation structure may be formed using one or more materials as alternatives to, or in addition to, a conventional ILD oxide. Thus, in various embodiments, the source/drain isolation structure may include a single layer or a stack of layers. In some cases, the one or more alternative materials used for the isolation structure may also have a higher breakdown field strength than a conventional ILD oxide. In some examples, the disclosed isolation structure may be formed having an L-shape such that a distance between a metal layer and an adjacent source/drain region is increased, thereby eliminating the bridging and reliability concerns discussed above. For purposes of illustration, and in accordance with various embodiments, FIG. 2 shows a cross-sectional view of an exemplary device 200 formed according to the methods disclosed herein, along a plane substantially parallel to a plane defined by section BB' or section CC' of FIG. 1. The device 200 includes a substrate 202, fins 204, source/drain regions 205, 207, isolation regions 206 (e.g., STI regions), an L-shaped dielectric layer 210, a metal layer 216 (contacting the source/drain region 205), and a metal layer 218 (contacting the source/drain region 207). In various embodiments, the L-shaped dielectric layer 210 ensures that the source/drain contact metal layers 216, 218 remain electrically isolated from each other. Further, the L-shaped dielectric layer 210 provides an increased spacing 's' and is formed using a more robust alternative material, as discussed below. As a result, the source/drain 207 remains electrically isolated from the source/drain contact metal layer 216. Further, the various embodiments disclosed herein provide for an increased TDDB window. Additional details of embodiments of the present disclosure are provided below, and additional benefits and/or other advantages will become apparent to those skilled in the art having benefit of the present disclosure.

Figure 3:
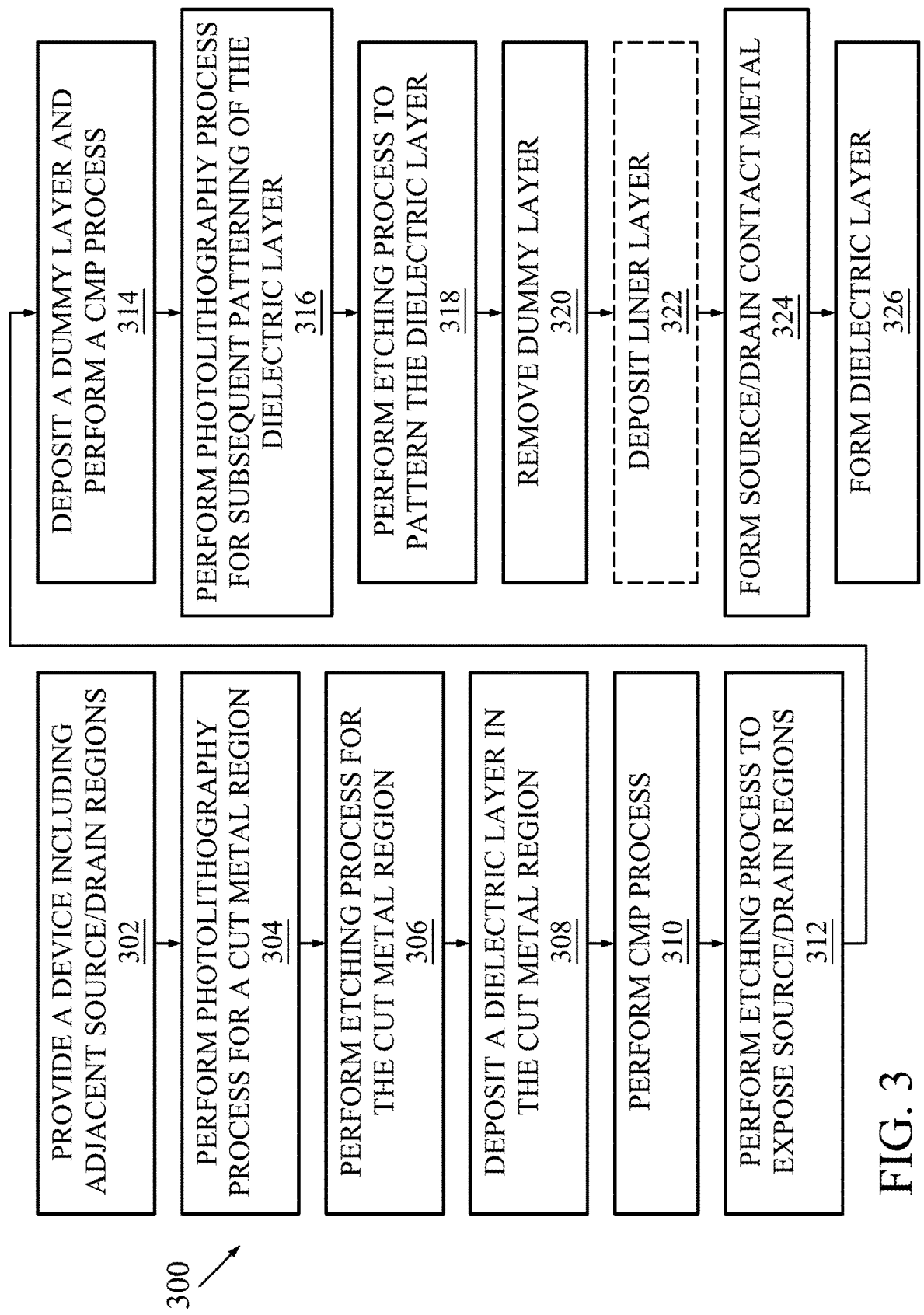
FIG. 3 illustrates a flow chart of a method of forming a source/drain isolation structure, in accordance with some embodiments.
Figure 18:
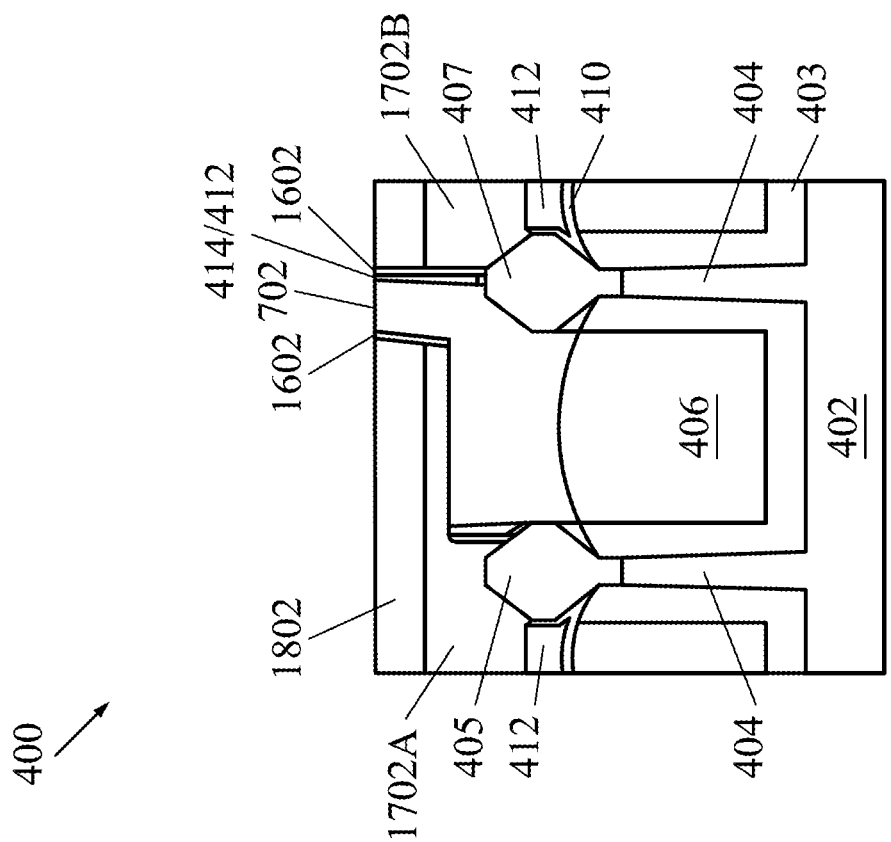

Referring now to FIG. 3, illustrated is a method 300 of forming a source/drain isolation structure, in accordance with some embodiments. The method 300 is described below in more detail with reference to FIGS. 4-18. In particular, FIGS. 4-18 provide cross-sectional views, along a plane substantially parallel to a plane defined by section BB' or section CC' of FIG. 1, of an exemplary device 400 fabricated according to one or more steps of the method 300 of FIG. 3. In addition, and in some embodiments, the method 300 may be used to fabricate the device 100, described above with reference to FIG. 1. Thus, one or more aspects discussed above with reference to the device 100 may also apply to the device 400 fabricated in accordance with the method 300. It will be understood that additional process steps may be implemented before, during, and after the method 300, and some process steps described may be replaced or eliminated in accordance with various embodiments of the method 300.

It is understood that parts of the method 300 and/or any of the exemplary transistor devices discussed with reference to the method 300 may be fabricated by a well-known complementary metal-oxide-semiconductor (CMOS) technology process flow, and thus some processes are only briefly described herein. Further, it is understood that any exemplary transistor devices discussed herein may include various other devices and features, such as additional transistors, bipolar junction transistors, resistors, capacitors, diodes, fuses, etc., but are simplified for a better understanding of the inventive concepts of the present disclosure. Further, in some embodiments, the exemplary transistor device(s) disclosed herein may include a plurality of semiconductor devices (e.g., transistors), which may be interconnected. In addition, in some embodiments, various aspects of the present disclosure may be applicable to either one of a gate-last process or a gate-first process.

In addition, in some embodiments, the exemplary transistor devices illustrated herein may include a depiction of a device at an intermediate stage of processing, as may be fabricated during processing of an integrated circuit, or portion thereof, that may comprise static random access memory (SRAM) and/or other logic circuits, passive components such as resistors, capacitors, and inductors, and active components such as P-channel field-effect transistors (PFETs), N-channel FETs (NFETs), metal-oxide-semiconductor field-effect transistors (MOSFETs), complementary metal-oxide-semiconductor (CMOS) transistors, bipolar transistors, high voltage transistors, high frequency transistors, other memory cells, and/or combinations thereof.

Referring now to the method 300, the method 300 begins at block 302 where a device including adjacent source/drain regions is provided. With reference to FIG. 4, and in an embodiment of block 302, a device 400 including adjacent first and second source/drain regions 405, 407 is provided. In some embodiments, the device 400 may be similar to the device 100, discussed above, where the first and second source/drain regions 405, 407 may be similar to adjacent source regions 105 along the plane BB' of FIG. 1. Alternatively, in some examples, the first and second source/drain regions 405, 407 may be similar to adjacent drain regions 107 along the plane CC'. The device 400 further includes a substrate 402, fins 404, and isolation regions 406 (e.g., STI regions). In various examples, the substrate 402, fins 404, first and second source/drain regions 405, 407, and isolation regions 406 may be similar to the substrate 102, fins 104, source/drain regions 105, 107, and isolation regions 106, discussed above with reference to FIG. 1.

In some embodiments, the device 400 may also include an STI liner layer 403 (e.g., such as silicon oxide, silicon nitride, or other appropriate layer), which may be formed prior to deposition of the isolation regions 406. The device 400 may also include an etch stop layer 410 formed over the isolation regions 406 and over the first and second source/drain regions 405, 407. In some examples, the etch stop layer 410 may include SiCO, SiC, oxide, a low-K dielectric, or other appropriate layer. In some examples, the device 400 further includes a first inter-layer dielectric (ILD) 412 and a second ILD 414 formed over the device 400, including over the etch stop layer 410. By way of example, the first and second ILD layers 412, 414 may include an oxide layer, a low-K dielectric layer, or other appropriate dielectric layer. In some embodiments, the device 400 also includes a hardmask 416 formed over the second ILD 414, and which will protect portions of the device 400 during subsequent processing. By way of example, the hardmask 416 may include an oxide layer, a nitride layer, an oxynitride layer, or a combination thereof.

The method 300 then proceeds to block 304 where a photolithography process for a cut metal region is performed. Referring to the example of FIGS. 4 and 5, in an embodiment of block 304, a photoresist layer 502 is deposited over the hardmask 416 (e.g., by spin-on coating). In some examples, after forming the photoresist layer 502, additional photolithography steps may include soft baking, mask aligning, exposure, post-exposure baking, developing, rinsing, drying (e.g., spin-drying and/or hard baking), other suitable lithography techniques, and/or combinations thereof. As a result of the photolithography process, a pattern including an opening 504 is formed within the photoresist layer 502, where such a pattern may then be used as a mask during subsequent etching of underlying layers (e.g., such as the hardmask 416, the first and second ILD layers 412, 414, and/or the etch stop layer 410).

The method 300 then proceeds to block 306 where an etching process for the cut metal region is performed. Referring to the example of FIGS. 5 and 6, in an embodiment of block 306, an etching process is performed (e.g., through the opening 504 of the patterned photoresist layer 502), where the etching process removes portions of the hardmask 416, the first and second ILD layers 412, 414, and portions of the etch stop layer 410 to form an opening 602. In some embodiments, the etching process (and thus the opening 602) may expose a portion of the isolation region 406 disposed between the first and second source/drain regions 405, 407, as well as portions of one or both of the first and second source/drain regions 405, 407. In various embodiments, the etching process may include a dry etching process (e.g., RIE or ICP etching), a wet etching process, or a combination thereof. It is also noted that the etching process employed may include a selective etching process, such as a selective wet or selective dry etching process, that provides for removal of desired portions of the hardmask 416, the first and second ILD layers 412, 414, and the etch stop layer 410, without substantial removal of other layers that may be exposed to the etching process (e.g., such as the isolation region 406 and/or the first and second source/drain regions 405, 407). In some embodiments, and after the etching process, the patterned photoresist layer 502 may be removed (e.g., using an appropriate solvent).

The method 300 then proceeds to block 308 where a dielectric layer is deposited in the cut metal region. Referring to the example of FIGS. 6 and 7, in an embodiment of block 308, a dielectric layer 702 is deposited over the device 400, including within the opening 602 formed during the etching process of block 306. In some embodiments, the dielectric layer 702 includes SiC, LaO, AlO, AlON, ZrO, HfO, SiN, Si (e.g., undoped Si), ZnO, ZrN, ZrAlO, TiO, TaO, YO, TaCN, ZrSi, SiOCN, SiOC, SiCN, HfSi, LaO, SiO, combinations thereof, or other suitable dielectric material. The dielectric layer 702 may be formed by ALD, PVD, CVD, oxidation, and/or other suitable methods. In various embodiments, the dielectric layer 702 is used to form the isolation structure between the adjacent first and second source/drain regions 405, 407, as described below. In some examples, the dielectric layer 702 may have a higher breakdown field strength than a material used for the first and second ILD layers 412, 414. It is also noted that in some cases, formation of the opening 602 may not entirely remove the first ILD layer 412, such that the dielectric layer 702 is subsequently formed over the remaining portion of the first ILD layer 412, to provide a multi-layer isolation structure.

The method 300 then proceeds to block 310 where a chemical mechanical polishing (CMP) process is performed. Referring to the example of FIGS. 7 and 8, in an embodiment of block 310, a CMP process is performed to remove excess material (e.g., excess material of the dielectric layer 702) and planarize the top surface of the device 400. In some embodiments, the CMP process may be configured to stop on the hardmask 416.

The method 300 then proceeds to block 312 where an etching process is performed to expose the source/drain regions. Referring to the example of FIGS. 8 and 9, in an embodiment of block 312, an etching process is performed to expose the adjacent first and second source/drain regions 405, 407. For example, the etching process may remove the hardmask 416, as well as substantial portions of the first and second ILD layers 412, 414, and portions of the etch stop layer 410 over the first and second source/drain region 405, 407 to expose portions of the first and second source/drain regions 405, 407. In some embodiments, unetched portions of one or both of the first and second ILD layers 412, 414 may remain on sidewalls of the dielectric layer 702, as shown in FIG. 9. In some embodiments, a thickness of the unetched portions of the ILD layers 412, 414 that remains on sidewalls of the dielectric layer 702 may be between about 0 nm (no ILD portion remains) and 25 nm. In various embodiments, the etching process may include a dry etching process (e.g., RIE or ICP etching), a wet etching process, or a combination thereof. It is also noted that the etching process employed may include a selective etching process, such as a selective wet or selective dry etching process, that provides for removal of desired portions of the hardmask 416, the first and second ILD layers 412, 414, and the etch stop layer 410, without substantial removal of other layers such as the dielectric layer 702. Thus, in the present etching process the dielectric layer 702 may effectively serve as a hardmask. Moreover, in contrast to at least some existing implementations where an aggressively-scaled hardmask may peel off during the source/drain region etching process, the dielectric layer 702 effectively provides a much larger and more robust hardmask that will not peel off during the etching process of block 312. This also helps to prevent detrimental bridging (e.g., electrical shorting), as previously discussed.

The method 300 then proceeds to block 314 where a dummy layer is deposited, and a CMP process is performed. Referring to the example of FIGS. 9 and 10, in an embodiment of block 314, a dummy layer 1002 is deposited over the device 400, including over the exposed first and second source/drain regions 405, 407. In some embodiments, the dummy layer 1002 includes a spin-on-glass (SOG) layer.

Generally, in various embodiments, the dummy layer 1002 is selected to have a high selectivity as compared to adjacent materials (e.g., such as the dielectric layer 702) to provide for selective layer removal during subsequent processing. The dummy layer 1002 may be formed by ALD, PVD, CVD, oxidation, and/or other suitable methods. After formation of the dummy layer 1002, and in a further embodiment of block 314, a CMP process is performed. Referring to the example of FIGS. 10 and 11, a CMP process is performed to remove excess material (e.g., excess material of the dummy layer 1002) and planarize the top surface of the device 400. In some embodiments, the CMP process may be configured to stop on the dielectric layer 702.

The method 300 then proceeds to block 316 where a photolithography process for subsequent patterning of the dielectric layer is performed. Referring to the example of FIGS. 11 and 12, in an embodiment of block 316, a photoresist layer 1202 is deposited over the device 400 (e.g., by spin-on coating). In some examples, after forming the photoresist layer 1202, additional photolithography steps may include soft baking, mask aligning, exposure, post-exposure baking, developing, rinsing, drying (e.g., spin-drying and/or hard baking), other suitable lithography techniques, and/or combinations thereof. As a result of the photolithography process, a pattern including an opening 1204 is formed within the photoresist layer 1202, where such a pattern may then be used as a mask during subsequent etching of underlying layers (e.g., such as the dielectric layer 702).

The method 300 then proceeds to block 318 where an etching process to pattern the dielectric layer is performed. Referring to the example of FIGS. 12 and 13, in an embodiment of block 318, an etching process is performed (e.g., through the opening 1204 of the patterned photoresist layer 1202), where the etching process removes portions of the dielectric layer 702, together with at least some of an unetched portion of the first and/or second ILD layers 412, 414 that previously remained on at least one sidewall of the dielectric layer 702 to form an opening 1302. In various embodiments, the etching process may include a dry etching process (e.g., RIE or ICP etching), a wet etching process, or a combination thereof. It is also noted that the etching process employed may include a selective etching process, such as a selective wet or selective dry etching process, that provides for removal of desired portions of the dielectric layer 702 and portions of the first and second ILD layers 412, 414 (if necessary), without substantial removal of other layers that may be exposed to the etching process (e.g., such as the dummy layer 1002). Stated another way, the dummy layer 1002 may be resistant to the etching process of block 318.

In various examples, the etching process of block 318 is further configured to pattern the dielectric layer 702 into an L-shape, where the L-shaped dielectric layer 702 is used to form the isolation structure between the adjacent first and second source/drain regions 405, 407. In some embodiments, the etching process is controlled (e.g., by controlling etch time, temperature, etchant gases, etc.) to provide a desired thickness 't' of a bottom portion of the L-shaped dielectric layer 702, as shown in FIG. 13. In various examples, the thickness 't' may be in a range of about 0.5 nm-100 nm. The bottom portion of the L-shaped dielectric layer 702 may have a top surface 1304, where the top surface 1304 defines a plane DD'. In at least some embodiments, the plane DD' of the top surface 1304 is disposed above a top surface of the first and second source/drain regions 405, 407. Generally, the thickness 't', and thus the plane DD' of the top surface 1304, are selected to avoid the detrimental bridging and/or reliability concerns (e.g., TDDB), discussed above. After the etching process, in some embodiments, the patterned photoresist layer 1202 may be removed (e.g., using an appropriate solvent), as shown in FIG. 14.

The method 300 then proceeds to block 320 where the dummy layer is removed. Referring to the example of FIGS. 14 and 15, in an embodiment of block 320, the dummy layer 1002 is removed from the device 400 to once again expose the adjacent first and second source/drain regions 405, 407. In various embodiments, the dummy layer 1002 may be removed using an etching process such as a dry etching process (e.g., RIE or ICP etching), a wet etching process, or a combination thereof. As previously noted, the dummy layer 1002 is selected to have a high selectivity as compared to adjacent materials to provide for selective layer removal. Thus, in various examples, the etching process of block 320 may include a selective etching process, such as a selective wet or selective dry etching process, that provides for removal of the dummy layer 1002, without substantial removal of other layers that may be exposed to the etching process (e.g., such as any remaining portions of the first and second ILD layers 412, 414, remaining portions of the etch stop layer 410, the L-shaped dielectric layer 702, and the first and second source/drain regions 405, 407).

The method 300 then proceeds to block 322 where a liner layer is deposited. Referring to the example of FIGS. 15 and 16, in an embodiment of block 322, a liner layer 1602 is optionally deposited over the device 400. In some embodiments, the liner layer 1602 may be deposited conformally over the device 400, including over the L-shaped dielectric layer 702, over any remaining portions of the first and second ILD layers 412, 414, and over the first and second source/drain regions 405, 407. After depositing the liner layer 1602, an etch-back process may be performed to remove some portions of the liner layer 1602 (e.g., from over the first and second source/drain regions 405, 407 and top surfaces of the L-shaped dielectric layer 702), while other portions of the liner layer 1602 remain on sidewalls of the L-shaped dielectric layer 702 and/or on the remaining portions of the ILD layers 412, 414 disposed on sidewalls of the L-shaped dielectric layer 702, as shown in FIG. 16. In some embodiments, the etch-back process may include a wet etch, a dry etch, or a combination thereof. In some cases, the liner layer 1602 may include AlO, AlON, SiC, ZrO, HfO, SiN, Si (e.g., undoped Si), ZrAlO, TiO, ZrSi, SiOCN, SiOC, SiCN, HfSi, SiO, combinations thereof, or other suitable material. The liner layer 1602 may be formed by ALD, PVD, CVD, and/or other suitable methods. In various embodiments, a thickness of the liner layer 1602 may be between about 0 nm (e.g., no liner layer) and 20 nm. It is noted that after the liner layer 1602 deposition and etch-back process, portions of the adjacent first and second source/drain regions 405, 407 remain exposed. In some cases, the liner layer 1602 is not deposited, effectively skipping block 322.

The method 300 then proceeds to block 324 where a source/drain contact metal is formed. Referring to the example of FIGS. 16 and 17, in an embodiment of block 324, a source/drain contact metal may be deposited over the device 400, including over the exposed portions of the first and second source/drain regions 405, 407, over the L-shaped dielectric layer 702, and over the liner layer 1602 on sidewalls of the L-shaped dielectric layer 702. In particular, the source/drain contact metal provides an electrical connection to the first and second source/drain regions 405, 407. In some embodiments, the source/drain contact metal may be deposited by PVD, e-beam evaporation, CVD, ALD, or other appropriate method. In some embodiments, the source/drain contact metal includes Ti, W, Co, Cu, Al, Mo, MoW, W, TiN, TaN, WN, silicides, combinations thereof, or other suitable conductive material. In some embodiments, a CMP process may be performed to remove excess portions of the source/drain contact metal and planarize the top surface of the device 400. In addition, the CMP process may be used to etch-back an upper portion of the L-shaped dielectric layer 702, including the liner layer and/or ILD layers 412, 414 disposed along sidewalls of the upper portion of the L-shaped dielectric layer 702. It is also noted that while the source/drain contact metal may be initially deposited as a continuous layer over the device 400, removal of the excess portion of the source/drain contact metal layer (e.g., by the CMP process) results in a first source/drain contact metal layer 1702A (contacting the first source/drain region 405), and a second source/drain contact metal layer 1702B (contacting the second source/drain region 407). Moreover, in accordance with various embodiments including the disclosed methods of forming the L-shaped dielectric layer 702, the first and second source/drain contact metal layers 1702A, 1702B remain electrically isolated from each other. Likewise, and again because of the L-shaped dielectric layer 702 (e.g., including the increased spacing 's' provided and the more robust material used for the dielectric layer 702), the second source/drain region 407 remains electrically isolated from the first source/drain contact metal layer 1702A. As a result, bridging and reliability concerns (e.g., TDDB) are effectively eliminated. It is further noted that the first source/drain contact metal layer 1702A may also include an L-shape corresponding to the L-shaped dielectric layer 702. In some embodiments, the L-shaped first source/drain contact metal layer 1702A and the L-shaped dielectric layer 702 may be positionally rotated with respect to each other, as shown, such that they form substantially interlocking L-shapes.

The method 300 then proceeds to block 326 where a dielectric layer is deposited in the cut metal region. Referring to the example of FIGS. 17 and 18, in an embodiment of block 326, a dielectric layer 1802 is deposited over the device 400. In some embodiments, the dielectric layer 1802 includes SiC, LaO, AlO, AlON, ZrO, HfO, SiN, Si (e.g., undoped Si), ZnO, ZrN, ZrAlO, TiO, TaO, YO, TaCN, ZrSi, SiOCN, SiOC, SiCN, HfSi, LaO, SiO, combinations thereof, or other suitable dielectric material. In some embodiments, the dielectric layer 1802 includes a self-aligned contact layer which may be subsequently patterned to provide openings through which electrical connections to underlying metal layers are provided (e.g., such as to the first and second source/drain contact metal layers 1702A, 1702B). The dielectric layer 1802 may be formed by ALD, PVD, CVD, oxidation, and/or other suitable methods. In some embodiments, the dielectric layer 1802 has a thickness of between about 0 nm (no dielectric layer 1802) and 50 nm. In some embodiments, after deposition of the dielectric layer 1802, a CMP process may be performed to remove excess material (e.g., excess material of the dielectric layer 1802) and planarize the top surface of the device 400.

The device 400 may undergo further processing to form various features and regions known in the art. For example, subsequent processing may form various contacts/vias/lines and multilayer interconnect features (e.g., metal layers and interlayer dielectrics) on the substrate, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure.

Elaborating further on various embodiments of the present disclosure, FIGS. 19A/19B, 20A/20B, 21A/21B, and 22A/22B illustrate various embodiments of device structures for devices fabricated according to the method 300. It will be understood that the illustrated device structures are merely exemplary, and the method 300 may be used to fabricate other device structures, while remaining within the scope of the present disclosure. Initially, and as noted above, formation of the opening 602 (block 306 of the method 300) may not entirely remove the first ILD layer 412, such that the dielectric layer 702 is subsequently formed over the remaining portion of the first ILD layer 412, to provide a multi-layer isolation structure. With reference to FIGS. 19A/19B and 21A/21B, illustrated therein are devices 1900A, 1900B, 2100A, 2100B having such a multi-layer isolation structure including an ILD layer (e.g., a portion of the ILD layer 412) and the dielectric layer 702. In some embodiments, a thickness of the ILD layer 412 that remains beneath the dielectric layer 702 may be in a range of about 0 nm-100 nm, where a thickness greater than 0 nm provides the disclosed multi-layer isolation structure. In contrast, and with reference to FIGS. 20A/20B and 22A/22B, illustrated therein are devices 2000A, 2000B, 2200A, 2200B where formation of the opening 602 (block 306) removed substantially all of the ILD layer material between the first and second source/drain regions 405, 407 such that the dielectric layer 702 (isolation structure) is formed directly on the isolation region 406. The devices 1900A, 1900B, 2000A, 2000B of FIGS. 19A/19B and 20A/20B also include a liner layer such as the liner layer 1602, discussed above, while the devices 2100A, 2100B, 2200A, 2200B of FIGS. 21A/21B and 22A/22B do not include the liner layer. In examples, where the liner layer is not deposited, a pre-clean process may be performed prior to deposition of the source/drain contact metal such that portions of the ILD layers 412, 414 previously disposed on sidewalls of the dielectric layer 702 (e.g., such as shown in FIG. 15) are removed, as illustrated in FIGS. 21A/21B and 22A/22B. Lastly, the devices 1900A, 2000A, 2100A, 2200A of FIGS. 19A, 20A, 21A, 22A include the dielectric layer 1802, discussed above, while the devices 1900B, 2000B, 2100B, 2200B of FIGS. 19B, 20B, 21B, 22B do not include the dielectric layer 1802.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures directed to forming a source/drain isolation structure. In some embodiments, the disclosed source/drain isolation structure is formed using a more robust hardmask (e.g., thicker than at least some conventional hardmasks) that will not peel off during an etching process. In addition, the source/drain isolation structure may be formed using one or more materials as alternatives to, or in addition to, a conventional ILD oxide. Thus, in various embodiments, the source/drain isolation structure may include a single layer or a stack of layers. In some cases, the one or more alternative materials used for the isolation structure may also have a higher breakdown field strength than a conventional ILD oxide. In some examples, the disclosed isolation structure may be formed having an L-shape such that a distance between a metal layer and an adjacent source/drain region is increased, thereby eliminating the bridging and reliability concerns discussed above. Further, the various embodiments disclosed herein provide for an increased TDDB window. Additional embodiments and advantages will be evident to those skilled in the art in possession of this disclosure.

Thus, one of the embodiments of the present disclosure described a method including providing a device having a first source/drain region adjacent to a second source/drain region. The method further includes depositing a masking layer between the first and second source/drain regions and over an exposed first part of the second source/drain region. In some embodiments, and after depositing the masking layer, a first portion of an ILD layer disposed on either side of the masking layer is etched, without substantial etching of the masking layer, to expose a second part of the second source/drain region and to expose the first source/drain region. In some examples, and after etching the first portion of the ILD layer, the masking layer may be etched to form an L-shaped masking layer. In various examples, and after forming the L-shaped masking layer, a first metal layer is formed over the exposed first source/drain region and a second metal layer is formed over the exposed second part of the second source/drain region.

In another of the embodiments, discussed is a method including providing a device having a first source/drain region adjacent to a second source/drain region and an ILD layer disposed over the first and second source/drain regions. In some embodiments, the method further includes removing a first part of the ILD layer to expose an STI region between the source/drain regions and depositing a dielectric layer over the exposed STI region. After depositing the dielectric layer, a second part of the ILD layer may be removed to expose at least parts of each of the first and second source/drain regions. In some examples, and after removing the second part of the ILD layer, the dielectric layer is etched to form an L-shaped dielectric layer. In some embodiments, a bottom portion of the L-shaped dielectric layer includes a top surface defining a plane that is disposed above a top surface of the first and second source/drain regions. After forming the L-shaped dielectric layer, a first metal layer is deposited over the exposed part of the first source/drain region and a second metal layer is deposited over the exposed part of the second source/drain region.

In yet another of the embodiments, discussed is a semiconductor device including a first source/drain region and a second source/drain region adjacent to the first source/drain region. In some embodiments, the semiconductor device further includes an L-shaped isolation structure interposing the first and second source/drain regions, where the L-shaped isolation structure contacts at least part of the second source/drain region, and where a bottom portion of the L-shaped isolation structure includes a top surface defining a plane that is disposed above a top surface of the first and second source/drain regions. In some examples, the semiconductor device further includes a first metal layer in contact with the first source/drain region and a second metal layer in contact with the second source/drain region, where the L-shaped isolation structure provides electrical isolation between the first and second metal layers and between the first metal layer and the second source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a first fin structure and a second fin structure extending from a semiconductor substrate;
   growing a first epitaxial feature on the first fin structure and a second epitaxial feature on the second fin structure;
   forming a dielectric layer between the first epitaxial feature and the second epitaxial feature, wherein the dielectric layer extends over at least one of the first epitaxial feature or the second epitaxial feature;
   etching a first portion of the dielectric layer to reduce the first portion of the dielectric layer to a second thickness and wherein a second portion of the dielectric layer remains at an initial thickness, greater than the second thickness; and
   after the etching, depositing a metal layer, wherein a first portion of the metal layer contiguously extends from over the first epitaxial feature to over the first portion of the dielectric layer having the second thickness and wherein a second portion of the metal layer is disposed over the second epitaxial feature;
   wherein the first portion of the dielectric layer includes a top surface that defines a first plane, and wherein the first plane is disposed above a top surface of the first and second epitaxial features.

2. The method of claim 1, wherein the second portion of the metal layer interfaces a first sidewall of the second portion of the dielectric layer.

3. The method of claim 2, wherein the first portion of the metal layer interfaces a second sidewall of the second portion of the dielectric layer opposite the first sidewall.

4. The method of claim 1, further comprising:
   prior to depositing the metal layer, forming a liner layer along a first sidewall of the first portion of the dielectric layer and along a second sidewall of the second portion of the dielectric layer.

5. The method of claim 1, further comprising:
   prior to forming the dielectric layer, forming an opening in an inter-layer dielectric (ILD) layer to expose a shallow trench isolation (STI) region interposing the first epitaxial feature and the second epitaxial feature; and
   forming the dielectric layer within the opening over the exposed STI region.

6. The method of claim 1, further comprising:
   prior to forming the dielectric layer, thinning an ILD layer disposed over an STI region that interposes the first epitaxial feature and the second epitaxial feature; and
   forming the dielectric layer over the thinned ILD layer.

7. The method of claim 1, wherein unetched portions of an ILD layer remain on sidewalls of the dielectric layer and interpose the dielectric layer and each of the first portion of the metal layer and the second portion of the metal layer.

8. The method of claim 7, prior to depositing the metal layer, forming a liner layer on the unetched portions of the ILD layer that remain on the sidewalls of the dielectric layer.

9. The method of claim 1, wherein after the etching, the first and second portions of the dielectric layer collectively define an L-shaped dielectric layer.

10. A method, comprising:
forming a multi-layer isolation structure between a first epitaxial feature and a second epitaxial feature, wherein a top layer of the multi-layer isolation structure extends over part of the second epitaxial feature;
etching a first part of the top layer of the multi-layer isolation structure to reduce a first portion of the multi-layer isolation structure adjacent to the first epitaxial feature to a lesser thickness than a second portion of the multi-layer isolation structure adjacent to the second epitaxial feature; and
after the etching, forming a first metal layer that contiguously extends from over the first epitaxial feature to over the first portion of the multi-layer isolation structure adjacent to the first epitaxial feature and a second metal layer disposed over the second epitaxial feature.

11. The method of claim 10, wherein the multi-layer isolation structure electrically isolates the first metal layer from the second metal layer.

12. The method of claim 10, further comprising:
prior to forming the first and second metal layers, forming a liner layer along sidewalls of the multi-layer isolation structure.

13. The method of claim 10, further comprising:
prior to forming the top layer of the multi-layer isolation structure, thinning an ILD layer disposed over an STI region that interposes the first epitaxial feature and the second epitaxial feature to provide a bottom layer of the multi-layer isolation structure; and
forming the top layer of the multi-layer isolation structure over the bottom layer of the multi-layer isolation structure.

14. The method of claim 10, wherein unetched portions of an ILD layer remain on sidewalls of the multi-layer isolation structure and interpose the multi-layer isolation structure and each of the first metal layer and the second metal layer.

15. The method of claim 14, prior to forming the first and second metal layers, forming a liner layer on the unetched portions of the ILD layer that remain on the sidewalls of the multi-layer isolation structure.

16. The method of claim 10, wherein a top surface of the first portion of the multi-layer isolation structure adjacent to the first epitaxial feature defines a first plane disposed above a top surface of the first and second epitaxial features.

17. The method of claim 10, wherein after the etching, the first and second portions of the multi-layer isolation structure collectively define an L-shaped multi-layer isolation structure.

18. A method, comprising:
forming a masking layer between adjacent source/drain regions and over at least part of one of the adjacent source/drain regions;
etching part of the masking layer to form a first masking layer portion having a first thickness and a second masking layer portion having a second thickness greater than the first thickness;
after etching part of the masking layer, forming a liner layer on sidewalls of the masking layer; and
after forming the liner layer, forming a metal layer over each of the adjacent source/drain regions, wherein the metal layers formed over respective ones of the adjacent source/drain regions are separated by the second masking layer portion.

19. The method of claim 18, wherein an unetched portion of an ILD layer remains on sidewalls of the masking layer, and wherein the forming the liner layer includes forming the liner layer on the unetched portion of the ILD layer.

20. The method of claim 18, wherein the first masking layer portion includes a top surface that defines a first plane disposed above a top surface of the adjacent source/drain regions.

* * * * *